(12) United States Patent
Padiyath et al.

(10) Patent No.: US 7,271,534 B2
(45) Date of Patent: Sep. 18, 2007

(54) SEGMENTED ORGANIC LIGHT EMITTING DEVICE

(75) Inventors: Raghunath Padiyath, Woodbury, MN (US); Jon E. Ottman, Eagan, MN (US); David A. Engler, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 157 days.

(21) Appl. No.: 10/701,337

(22) Filed: Nov. 4, 2003

(65) Prior Publication Data
US 2005/0094394 A1    May 5, 2005

(51) Int. Cl.
*H05B 33/00* (2006.01)
(52) U.S. Cl. ............................ 313/504; 313/506; 313/1
(58) Field of Classification Search ........ 313/498–512, 313/3, 1
See application file for complete search history.

(56) References Cited

U.S. PATENT DOCUMENTS

| | | | |
|---|---|---|---|
| 4,138,620 A * | 2/1979 | Dickson | 313/1 |
| 5,408,109 A | 4/1995 | Heeger et al. | |
| 5,929,562 A * | 7/1999 | Pichler | 313/506 |
| 6,042,894 A | 3/2000 | Goto et al. | |
| 6,107,734 A | 8/2000 | Tanaka et al. | |
| 6,137,221 A | 10/2000 | Roitman et al. | |
| 6,345,903 B1 * | 2/2002 | Koike et al. | 362/249 |
| 6,355,125 B1 | 3/2002 | Tahon et al. | |
| 6,410,201 B2 | 6/2002 | Wolk et al. | |
| 6,447,898 B1 | 9/2002 | Pfaff | |
| 6,479,941 B1 | 11/2002 | Abe et al. | |
| 6,525,467 B1 | 2/2003 | Eida et al. | |
| 6,534,581 B1 | 3/2003 | Kleyer et al. | |
| 6,579,422 B1 | 6/2003 | Kakinuma | |
| 6,593,690 B1 | 7/2003 | McCormick et al. | |
| 6,621,213 B2 | 9/2003 | Kawashima | |
| 6,649,433 B2 | 11/2003 | Mikhael et al. | |
| 6,664,730 B2 | 12/2003 | Weaver | |
| 6,787,990 B2 | 9/2004 | Cok | |
| 6,794,815 B2 | 9/2004 | Lee et al. | |
| 6,858,874 B2 | 2/2005 | Wu et al. | |
| 6,867,539 B1 | 3/2005 | McCormick et al. | |
| 6,936,964 B2 | 8/2005 | Cok | |

(Continued)

FOREIGN PATENT DOCUMENTS

EP    1115268    7/2001

(Continued)

OTHER PUBLICATIONS

Fault-tolerant, scalable organic light-emitting device architecture, 2003 American Institute of Physics, Applied Physics Letter, vol. 82, No. 16, Apr. 21, 2003, pp. 2580-2582.

*Primary Examiner*—Ashok Patel
(74) *Attorney, Agent, or Firm*—Carolyn A. Fischer

(57) ABSTRACT

The invention relates to organic electronic devices and methods of manufacture comprising at least two segments, each segment comprising an organic electronic light-emitting device wherein each segment is defined by peripheral edges; wherein each segment comprises a first electrical contact disposed on a first peripheral edge and a second electrical contact disposed on a different peripheral edge than the first electrical contact and the electrical contacts of each segment are joined in electrical communication with a conductive material.

32 Claims, 2 Drawing Sheets

U.S. PATENT DOCUMENTS

| | | |
|---|---|---|
| 2001/0026126 A1* | 10/2001 | Nakaya et al. ............... 313/506 |
| 2002/0071082 A1 | 6/2002 | Okita et al. |
| 2002/0190661 A1 | 12/2002 | Duggal et al. |
| 2002/0196205 A1 | 12/2002 | Yamakado et al. |
| 2003/0011724 A1 | 1/2003 | Sundahl |
| 2003/0068525 A1 | 4/2003 | Bellmann et al. |
| 2004/0119403 A1 | 6/2004 | McCormick et al. |
| 2005/0017628 A1 | 1/2005 | Prakash |

FOREIGN PATENT DOCUMENTS

| | | |
|---|---|---|
| JP | 09311737 | 12/1997 |
| JP | 10-208877 | 8/1998 |
| JP | 10-288952 | * 10/1998 |
| JP | 10319879 | 12/1998 |
| JP | 2003195973 | 7/2003 |

* cited by examiner

SEGMENTED ORGANIC LIGHT EMITTING DEVICE

FIELD OF THE INVENTION

The invention relates to organic electronic devices and methods of manufacture. The organic electronic device is preferably an organic light-emitting diode (OLED)

BACKGROUND OF THE INVENTION

Organic electronic devices are articles that include layers of organic materials, at least one of which can conduct an electric current. An example of an organic electronic device is an organic light-emitting diode (OLED). OLEDs typically consist of an organic light emitter layer and optional organic charge transport layers on both sides of the emitter disposed between two electrodes: a cathode and an anode. OLEDs, sometimes referred to as lamps, are desirable for use in electronic media because of their thin profile, low weight, and low driving voltage, e.g., less than about 20 volts. OLEDs have potential use in applications such as backlighting of graphics, pixelated displays, and large emissive graphics.

A "roll-to-roll" method for making OLED devices includes forming the various layers on a web substrate. In order to provide the proper arrangement of the various layers such as providing the cathode electrically isolated from the anode, multiple deposition and patterning steps are employed to manufacture the ultimate device structure. In particular, it is common practice to pattern the anode (e.g. indium-tin oxide), such as described in U.S. Pat. No. 6,410,201 and U.S. Pat. No. 6,579,422.

A problem associated with the development of larger area OLEDs is the presence of local defects that cause electrical shorts. Causes of shorting defects include, for example, particle contamination during fabrication, surface roughness often contributed from the electrode, and non-uniformities in the organic layer thickness. Local defects initially present as a result of fabrication imperfections are typically present as small non-emissive, non-conducting areas at the location of the electrical short. One approach to this problem is described in Applied Physics Letters, vol. 82, no. 16, Apr. 21, 2003 entitled "Fault-tolerant, scalable organic light-emitting device architecture". This article describes that, "Another obstacle to achieving large area devices results from the fact that OLEDs are current driven, i.e. brightness scales with current density. Thus, larger devices require a greater current to spread throughout the active area." This article addresses both of these obstacles to large area devices by fabricating a number of smaller light-emitting elements connected in series on a monolithic substrate.

Although various OLED structures and methods of manufacture have been described, industry would find advantage in improved structures and methods of manufacture.

SUMMARY OF THE INVENTION

The present invention discloses an organic electronic device comprising at least two segments. Each segment comprises an organic electronic light-emitting device that comprises a light-emitting layer disposed between two conductive layers wherein the conductive layers are electrically isolated from each other. The electrical contacts of the segments are joined in electrical communication with a conductive material.

In a first embodiment, the segments are defined by peripheral edges. Each segment comprises a first electrical contact disposed on a first peripheral edge and a second electrical contact disposed on a different peripheral edge such as a peripheral edge that is substantially perpendicular or substantially parallel to the first peripheral edge.

In a second embodiment, each segment has a first dimension ranging from about ⅛ inch (3.2 mm) to about 1 inch (2.5 cm) and a second dimension ranging from about 1 inch (2.5 cm) to about 10 inches (25 cm).

In another embodiment, the invention discloses a method of making an electronic device comprising providing a plurality of organic light-emitting device segments comprising electrical contacts, testing the segments to identify at least one segment that is a non-emitting segment, removing the non-emitting segment, and joining the electrical contact of the light-emitting segments with a conductive material. The segments can be tested sequentially or concurrently. A similar technique may be employed to repair an OLED device by replacement of a non-emitting segment (s).

With regard to each disclosed embodiment, each segment may comprise a continuous substrate layer. The substrate layer is discontinuous between segments. The conductive material is preferably flexible such as a metal foil, metallized polymeric film, conductive adhesive, and combinations thereof. The electrical contacts of the segments may be joined in parallel, yet are preferably joined in series. The plurality of segments may be joined in a row. Further, a plurality of rows may be joined in columns. Each segment may be encapsulated and/or the device may be encapsulated. The device is suitable for use as a single colored (e.g. white) or multiple colored backlight for lamps, fixed and variable message displays as well as signs, toys, and personal protection apparel.

DETAILED DESCRIPTION OF THE PREFERRED EMBODIMENTS

Figure 1:
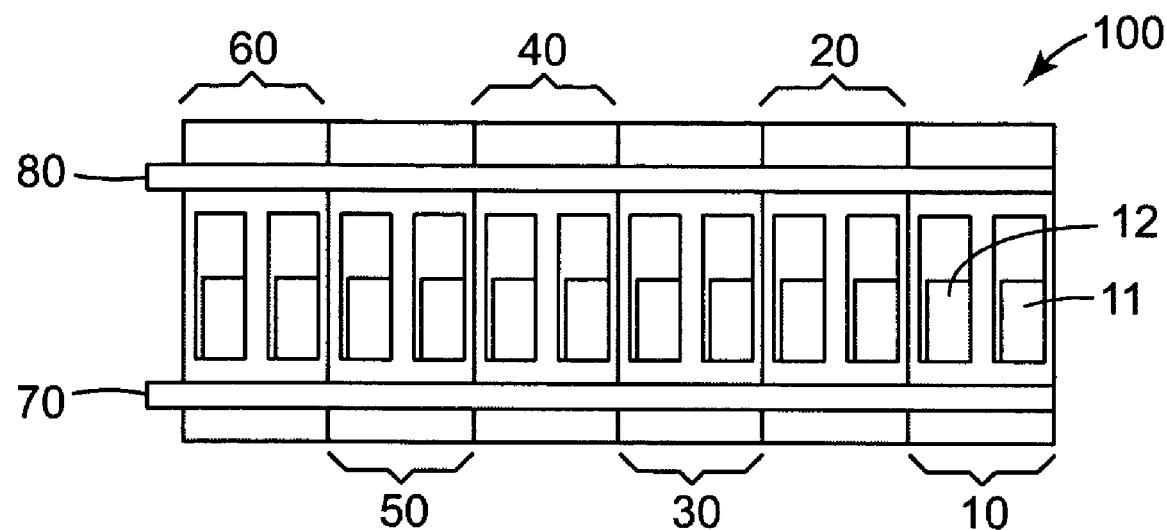
FIG. 1 depicts an exemplary device in accordance with the invention comprising a row of segments.

Organic electroluminescent devices (OLEDs) and methods of preparing OLEDs are provided. In particular, OLED devices are provided that comprise at least two and preferably a plurality of segments, each segment comprising at least one discrete OLED device (i.e. light-emitting area). The electrodes of at least two segments are joined in electrical communication.

As used herein, "organic electroluminescent device segment" refers to an article that includes a layer, or layers, of at least one organic electroluminescent material disposed between a first electrode and a second electrode. Typically, at least one of the electrodes can transmit light emitted by the organic electroluminescent material. Each segment typically comprises at least one continuous (e.g. substrate) layer throughout the dimensions of the segment. An electrode layer (e.g. anode) is typically disposed upon such continuous substrate layer. Optionally, an organic charge transport layer may be disposed between the continuous substrate layer and the electrode layer(s). Each segment comprises accessible electrical contacts that may be joined in electrical communication.

The segments are preferably derived from a roll-to roll process. Regardless of the manner of fabricating the segments, each segment is generally substantially planar, being defined by peripheral edges. The electrical contacts, i.e. a portion of the electrode layer that is exposed, are accessible on the peripheral edges of each segment. Typically the electrical contacts are present on the peripheral edges, yet do not extend beyond the dimensions of the segment. A first electrical contact (e.g. anode) is present on a first peripheral edge. A second electrical contact (e.g. cathode) is present on a different peripheral edge than the first electrical contact. For example, for substantially rectangular segments, the first electrical contact may be disposed on an edge defining the width of a segment and the second electrical contact may be disposed on an edge defining the length of the segment (i.e. perpendicular to the first edge). Preferably, however, the second electrical contact is disposed on a peripheral edge opposing the first electrical contact, such as in the case wherein the second electrical contact is disposed on a second peripheral edge parallel to the first peripheral edge. By positioning the electrical contacts on opposing peripheral edges (i.e. opposing ends) multiple segments can readily be joined in rows and columns while employing minimal conductive material to join the electrical contacts of the segments.

Each segment may be encapsulated individually prior to joining the electrical contacts. Encapsulation typically protects the atmospherically sensitive portions of the segment that would otherwise be exposed to the atmosphere. Alternatively or in addition thereto, the device may be encapsulated after joining the electrical contacts of the segments. However, the layers that are continuous throughout the dimension of an individual segment, such as a light transmissible substrate layer, are characteristically discontinuous between segments. Further, the continuous layers within a segment typically share a common dimension and thus share the same peripheral edges that define the segment. This ensures that the layers of each segment are discontinuous rather than overlap at the location wherein the segments are joined.

FIG. 1 shows a plan view of an exemplary organic electroluminescent device or display 100. This particular device is well suited for use as a lamp. The structure includes segments 10, 20, 30, 40, 50, and 60 each segment comprising an OLED segment. Each segment comprises at least one light-emitting area. Each exemplified segment each comprises a pair of light-emitting areas, such as depicted by light-emitting areas 11 and 12 of segment 10. The electrode contacts of the segments are joined in electrical communication with conductive material 70 and conductive material 80.

Figure 2:
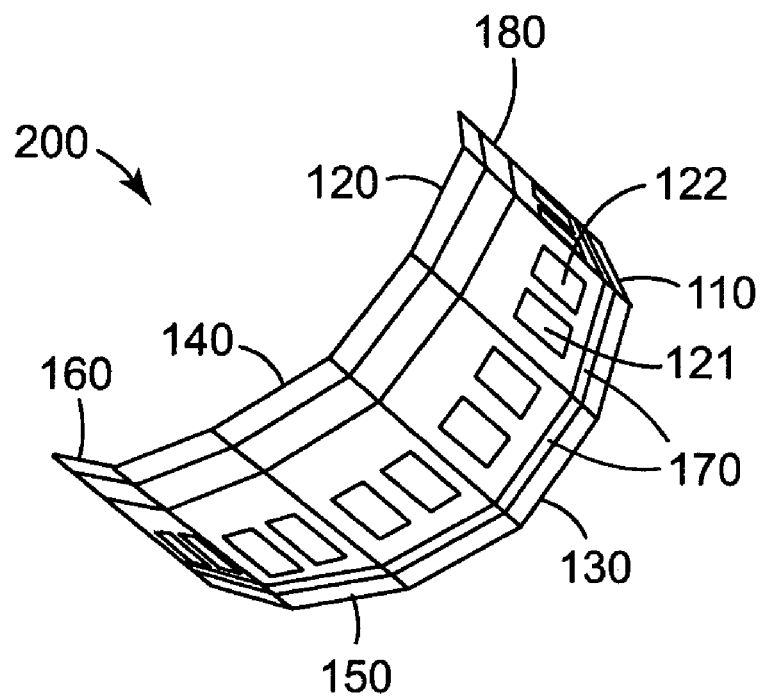
FIG. 2 depicts an exemplary device in accordance with the invention having a curved configuration.

FIG. 2 shows a three-dimensional view of an exemplary organic electroluminescent device or display 200 wherein the segments 110, 120, 130, 140, 150 and 160, each having a pair of light-emitting areas (e.g. 121 and 122 of segment 120) are joined in electrical communication with flexible conductive materials 170 and 180. This structure is particularly advantageous for conforming to a curved surface.

Although OLED devices are often described as flexible due to the devices being manufactured from flexible transparent polymeric layers as the substrate layer, such polymeric layers typically exhibit elastic memory. Thus, many of such materials have a tendency to recover or rebound from an applied stress. The elastic memory of various plastic materials can be measured with known techniques such as dynamic mechanical analysis (DMA). Furthermore, even though the OLED devices may be fabricated on plastic substrates that are flexible, various functional layers, such as indium tin oxide ("ITO") anode layers, are brittle and fragile. Such layers are prone to cracking when flexed over a small radius and/or flexed repeatedly. In the present invention, such (e.g. substrate and anode) layers are discontinuous between segments. Thus, the OLED devices of the present invention are substantially free of such layers at the locations wherein the segments are joined. Accordingly, any elastic recovery in the present invention is primarily a function of the conductive material employed to join the electrical contacts of the segments and not the substrate material. Additionally, fragile functionalized material may be used with reduced concern over cracking in response to repeated or small radius stress. Accordingly, preferred conductive materials employed herein are flexible and exhibit little to no elastic recovery.

Suitable flexible conductive materials include metal foils, conductive adhesives, metallized polymeric films, and combinations thereof. Exemplary metal foils include for example stainless steel, copper, aluminum, brass, etc. Copper is a preferred metal foil, since copper is highly conductive, can easily be soldered, ultrasonically welded, and works well with conductive adhesives. The conducting adhesive can be self-supporting. Alternatively, the conductive adhesive can be supported on a non-conducting flexible polymeric substrate (e.g. that permeates a porous polymeric film). Further, a conductive adhesive may be employed to adhere a metal foil to provide sufficient strength in order to keep the joined segments together. The adhesive and/or film(s) may be applied in any suitable manner such as roll dispensed or automated assembly.

Conductive adhesives generally comprise electroconductive particles dispersed in a polymeric binder. Various electroconductive particles are known such as those comprised of conductive carbon black, metal, conductive metal oxide; as well as glass, ceramic, and plastic particles having a metal deposit on the surface. The conductive adhesive may employ combinations of such particles as well. The particle shape may be spherical or cylindrical as in the case of glass and metal fibers. Various adhesive binder materials are known in the art such as rubbers (e.g. SBR, polyisobutylene, polybutene, natural rubber, neoprene, butyl rubber, etc.) and synthetic resins such as thermoplastic resins (e.g. polyethylene, vinyl acetate and polypropylene); highly heat-resistant resins such as polyether sulfone, polyether-imide and polyimide; heat-curable resins such as epoxy resin and phenol resin; and photocurable resins having acryloyl groups such as polyesteracrylate, urethane acrylate and epoxy acrylate. An exemplary conductive adhesive is commercially available from 3M Company, St. Paul, Minn. under the trade designation "3M9713". Exemplary conductive adhesives include for example silicone adhesive compositions described in U.S. Pat. No. 6,534,581 and thermoplastic heat-activatable adhesive sheets such as described in U.S. Pat. No. 6,447,898; both of which are incorporated herein by reference.

The segments may be joined in electrical communication in series. In doing so, the cathode of a first segment is connected to the anode of an adjacent segment. Further, the cathode of the second segment is connected to the anode of the third adjacent segment, etc. Rather, than being joined in electrical communication in rows as depicted in FIG. 1, the segments may be joined in series in columns, or joined in series in combinations of at least one row and at least one column. When arranged in this way, the resulting lighting strip may be operated with alternating current ("AC") power. One advantage of such an arrangement is that the lighting strip is insensitive to shorted segments. Alternatively, however, the segments may be joined in electrical communication in parallel wherein like first electrical contacts (e.g. cathodes) of adjacent segments are joined and like second electrical contacts (e.g. anode) of adjacent electrical contacts are joined.

The OLED device of the invention can include any number of segments arranged in various suitable manners. For example, in lamp applications for task lighting, the device can include a single row of segments as depicted in FIGS. 1 and 2. In lamp applications for example for backlights for liquid crystal display (LCD) modules, the device can include multiple segments arranged in rows and columns that span substantially the entire intended backlight area. The device may constitute a plurality of closely spaced segments that can be concurrently or independently activated. For example, relatively small and closely spaced red, green, and blue light emitters can be patterned between common electrodes so that device layer appears to emit white light when the emitters are activated. Each segment can represent a separate pixel or a separate sub-pixel of a pixilated display (e.g., high resolution display) a separate element or sub-element of a display (e.g., low information content display), or a separate icon, portion of an icon, or lamp for an icon (e.g., indication applications). These pixels, sub-pixels, elements and sub-elements may be directly or matrix addressed in order to display characters or information. Alternatively, segments emitting different color light (e.g. red, blue, and green) may be independently adjusted such as by the end user to obtain a specific lighting effect such as color (e.g. mood lighting) or hue of white light.

The size of the segments may vary. The device may comprise at least two or a plurality of segments wherein the segments are each approximately the same size. Alternatively, the device may comprise at least two or a plurality of segments having a variety of different sizes. For ease in joining the segments to cover a substantially large area having multiple rows of segments joined in electrical communication with minimal amounts of conductive material it is preferred that the segments have approximately the same width.

In order that the device or display has a uniform brightness for its intended usage life throughout the dimensions of light-emitting area, the length (i.e. longest dimension) of each segment can be chosen to minimize the voltage drop across the length of the segment. The suitable length for this purpose depends on the conductivity of the transparent conductor layer. Typically a suitable length for an anode layer having a resistivity of about 10 ohms/square is about 10 inches (25 cm) or less. Preferably the length is no greater than about 6 inches (15 cm). The length is at least about 1 inch (2.54 cm) and more preferably at least about 2 inches (5 cm). Typically the smallest dimension (i.e. width) of each segment is of sufficient size such that the segment can be readily joined in electrical communication by for example adhering a conductive foil to each segment using a conductive adhesive, conventional soldering or ultrasonic welding. Accordingly, each segment typically has a width of at least about ⅛ inch (3.2 mm), preferably of at least about ¾ inch (19 mm), and more preferably of at least about 1 inch (2.54 cm). The width of each segment is typically no greater than about 2 inches (5 cm).

The segments can be joined in a variety of arrangement depending on the intended end use. For example, a 2' by 4' recessed panel ceiling lighting in an office, can be made by joining in electrical communication 192 segments, each segment having a dimension of 1"×6", arranged in an array of 4 by 48. As another example, a backlight for a liquid crystal display used for a computer can be made by joining 20 segments, each segment having a dimension of 1"×6", arranged in an array of 2 by 10. In the case of a large area display used for example in a convention center, it would not be uncommon to join millions of segments to span the viewing area of the display.

A preferred method of making the device of the invention entails testing the segments prior to joining the segments in electrical communication. In doing so, non-emitting segments can be removed beforehand to ensure that the totality of segments are light-emitting. The segments can be tested concurrently or sequentially. For embodiments wherein the segments are fabricated in a roll-to-roll process, the non-emitting segments can be removed by cutting and removing the non-emitting portions. Depending on the manner in which the segments were fabricated, the web is typically severed in a direction non-parallel to the web direction, i.e. at an angle ranging from about perpendicular to diagonal to the advancing web direction (e.g. 45°). The remainder of the web may be spliced back together. Similarly, since the electrical contacts of the individual segments are accessible, the device of the present invention can be more easily repaired. A non-light emitting segment or portion of segments can be removed by severing the conductive material near the location of the electrical contacts electrical connections and replacing the removed segment or portion with operable light-emitting segment(s).

A wide variety of OLED segments may be employed in the device of the invention as known in the art. Such segments may be derived from batch processes. For ease in manufacturing, the segments are preferably derived from a (e.g. roll-to-roll) processes.

Figure 3:
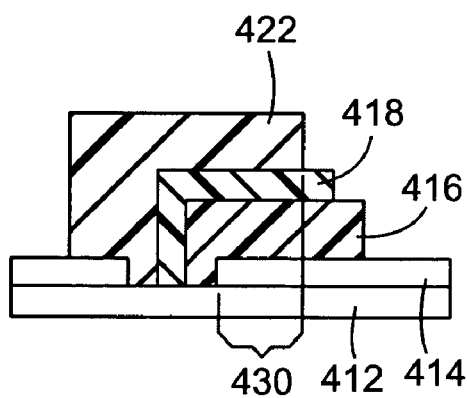
FIG. 3 depicts a cross-sectional view of an exemplary organic light-emitting segment for use in the invention.

FIG. 3 illustrates a typical OLED segment. The diode comprises a light transmissible substrate 412, a first electrode (e.g. anode) 414, a hole transporting layer 416, a light-emitting layer 418, and a second electrode (e.g. cathode) 422. The light-emitting area 430 emits light through substrate 412.

Substrate 412 may be transparent or semi-transparent. Further the substrate may be rigid or flexible. Suitable rigid transparent substrates include, for example, glass, polycarbonate, acrylic, and the like. Suitable flexible transparent substrates include for example, polyesters (e.g., polyethylene terephthalate, polyester naphthalate, and polycarbonate), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulphones such as polyethersulphone, and other conventional polymeric films. The substrate may optionally have barrier coatings, static dissipating properties or comprise an anti-static coating. For example, a poly(3,4-ethylenedioxythiophene) poly(styrenesulfonate) aqueous dispersion commercially available from Bayer under the trade designation "Baytron P" may be applied to the substrate followed by application of a barrier layer prior to application of the first electrode layer.

Generally, the electrodes are comprised of conductive materials such as metals, alloys, metallic compounds, metal oxides, conductive ceramics, conductive dispersions, and conductive polymers. Suitable materials can contain, for example, gold, platinum, palladium, nickel, aluminum, calcium, barium, magnesium, titanium, titanium nitride, indium tin oxide (ITO), fluorine doped tin oxide (FTO), graphite, and polyaniline. The electrodes can have a single layer or multiple layers of conductive materials. For example, an electrode can include a layer of aluminum and a layer of gold, a layer of calcium and a layer of aluminum, a layer of aluminum and a layer of lithium fluoride, or a metal layer and a conductive organic layer. For all applications, such as display and lighting applications, at least one of the electrodes (e.g anode) can transmit radiation emitted by the light-emitting structure.

Anode 414 is generally prepared from a material having a high work function (e.g., above about 4.5 eV). Typically, the anode can transmit radiation emitted by the light-emitting structure. Suitable materials include a thin layer of electronegative metals such as gold, platinum, nickel, graphite, silver, or combinations thereof. The anode can also be prepared from a metal oxide such as, for example, indium-tin oxide.

The cathode 422 is generally prepared from a material having a lower work function than the anode (e.g., below about 4.5 eV). Suitable materials include n-doped silicon, alkali metals, alkaline earth metals, and the like. For example, the cathode can contain lithium, calcium, barium, magnesium, or combinations thereof. Such cathode materials have a tendency to react with water, oxygen, or a combination thereof and can advantageously be protected by encapsulation.

Figure 5:
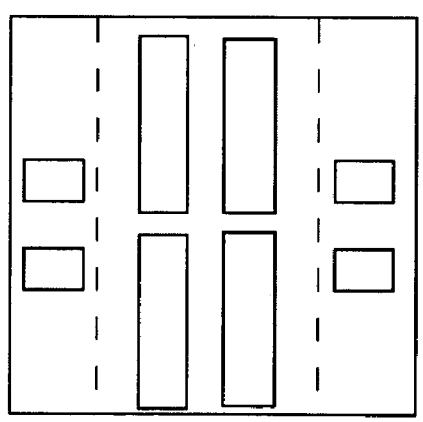
FIG. 5 depicts an exemplary mask for deposition of a patterned anode layer.

Methods for preparing the electrodes include, but are not limited to, sputtering, vapor deposition, laser thermal patterning, inkjet printing, screen printing, thermal head printing, and photolithographic patterning. The electrodes are most commonly prepared by vapor deposition. As used herein, the term "pattern" means that a component (e.g., electrode or conductive layer) is divided into two or more non-connected parts. In some embodiments, the component is patterned by removal of part of the component. For example, the component can be etched for example with the use of strong acids, e.g., to etch the conductive layer. In other embodiments, the component is patterned by deposition of the component in two or more areas that are not connected. For example, masks or printing methods can be used to deposit the component. FIG. 5 depicts a suitable mask for the cathode deposition used in the devices shown in FIGS. 1 and 2.

The light-emitting layer 418 typically contains at least one organic electroluminescent material. The electroluminescent material includes, but is not limited to, a fluorescent or phosphorescent material. The organic electroluminescent material can include, for example, a small molecule (SM) emitter (e.g., a non-polymeric emitter), a SM doped polymer, a light-emitting polymer (LEP), a doped LEP, or a blended LEP. The organic electroluminescent material can be provided alone or in combination with any other organic or inorganic materials that are functional or non-functional in an organic electroluminescent display or device.

In some embodiments, the organic electroluminescent material includes a light-emitting polymer. LEP materials are typically conjugated polymeric or oligomeric molecules that preferably have sufficient film-forming properties for solution processing. As used herein, "conjugated polymers or oligomeric molecules" refer to polymers or oligomers having a delocalized π-electron system along the polymer backbone. Such polymers or oligomers are semiconducting and can support positive and negative charge carriers along the polymeric or oligomeric chain.

Examples of classes of suitable LEP materials include poly(phenylenevinylenes), poly(para-phenylenes), polyfluorenes, other LEP materials now known or later developed, and co-polymers or blends thereof. Suitable LEPs can also be molecularly doped, dispersed with fluorescent dyes or photoluminescent materials, blended with active or non-active materials, dispersed with active or non-active materials, and the like. LEP materials can be formed into a light-emitting structure, for example, by casting a solvent solution of the LEP material on a substrate and evaporating the solvent to produce a polymeric film. Alternatively, LEP material can be formed in situ on a substrate by reaction of precursor species. Suitable methods of forming LEP layers are described in U.S. Pat. No. 5,408,109, incorporated herein by reference. Other methods of forming a light-emitting structure from LEP materials include, but are not limited to, laser thermal patterning, inkjet printing, screen printing, thermal head printing, photolithographic patterning, and extrusion coating. The light-emitting structure can include a single layer or multiple layers of LEP material or other electroluminescent material.

In some embodiments, the organic electroluminescent material can include one or more small molecule emitters. SM electroluminescent materials include charge transporting, charge blocking, and semiconducting organic or organometallic compounds. Typically, SM materials can be vacuum deposited or coated from solution to form thin layers in a device. In practice, multiple layers of SM materials are typically used to produce efficient organic electroluminescent devices since a given material generally does not have both the desired charge transport and electroluminescent properties.

SM materials are generally non-polymeric organic or organometallic materials that can be used in OEL displays and devices as emitter materials, charge transport materials, dopants in emitter layers (e.g., to control the emitted color), charge transport layers, and the like. Commonly used SM materials include N,N'-bis(3-methylphenyl)-N,N'-diphenylbenzidine (TPD) and metal chelate compounds such as tris(8-hydroxyquinoline) aluminum (AlQ).

The organic electroluminescent devices can optionally include a hole transporting layer 416, an electron transport layer, a hole injection layer, an electron injection layer, a hole blocking layer, an electron blocking layer, a buffer layer, and the like. These and other layers and materials can be used to alter or tune the electronic properties and characteristics of the OEL devices. For example, such layers and materials can be used to achieve a desired current/voltage response, a desired device efficiency, a desired brightness, and the like. Additionally, photoluminescent materials can be present to convert the light emitted by the organic electroluminescent materials to another color. These optional layers can be positioned between the two electrodes and can be part of the light-emitting layer or a separate layer.

For example, the organic electroluminescent device can optionally include a hole transport layer between the light-emitting structure and one of the first or second electrodes. The hole transport layer facilitates the injection of holes into the device and the migration of the holes towards the cathode. The hole transport layer can further act as a barrier for the passage of electrons to the anode. The hole transport layer can include, for example, a diamine derivative, such as N,N'-bis(3-methylphenyl)-N,N'-bis(phenyl)benzidine, N,N'-bis(3-naphthalen-2-yl)-N,N-bis(phenyl)benzidine, or a triarylamine derivative, such as 4,4',4"-tris(N,N'-diphenylamino)triphenylamine, or 4,4',4"-tris(N-3-methylphenyl-N-phenylamino)triphenylamine. Other examples include copper phthalocyanine and 1,3,5-tris(4-diphenylaminophenyl) benzenes. The organic electroluminescent device can optionally include an electron transport layer between the light-emitting structure and one of the first or second electrodes. The electron transport layer facilitates the injection of electrons and their migration towards the recombination zone. The electron transport layer can further act as a barrier for the passage of holes to the cathode. Preventing the holes from reaching the cathode and the electrons from reaching the anode will result in an electroluminescent device having higher efficiency. Suitable materials for the electron transport layer include, for example, tris(8-hydroxyquinolato) aluminum, 1,3-bis[5-(4-(1,1-dimethylethyl)phenyl)-1,3,4-oxadiazol-2-yl]benzene, 2-(biphenyl-4-yl)-5-(4-(1,1-dimethylethyl)phenyl)-1,3,4-oxadiazole, and other compounds as are known in the art.

In one embodiment, the electrodes, light-emitting structure, and/or other optional layers may be formed by transferring one or more layers by laser thermal patterning. For example, the organic electroluminescent material can be coated on a donor sheet and then selectively transferred alone or in combination with other layers or with one or more electrodes to a receptor sheet. The receptor sheet can be pre-patterned with one or more electrodes, transistors, capacitors, insulator ribs, spacers, color filters, black matrix, hole transport layers, electron transport layers, other elements suitable for electronic displays and devices, or a combination thereof.

The segments may be encapsulated individually prior to joining the segments or the device may be encapsulated after the segments are joined in electrical communication. As used herein, the term "encapsulated" refers to having the (e.g. cathode) electrode surfaces free of exposure to oxygen and water. For embodiments wherein the segments are individually encapsulated, openings are made in the encapsulant layer to expose the electrical contacts. Depending on the composition of the various components, the useful lifetime of the organic electroluminescent device can be extended by encapsulation. For example, some electrode materials and light-emitting structures deteriorate upon prolonged exposure to oxygen, moisture, or a combination thereof. Encapsulation reduces contact of the second electrode or the light-emitting structure with oxygen or moisture.

The segment or device are typically encapsulated with a non-conductive material including, but is not limited to, ceramic material, glass material, polymeric material, and the like. The typical thickness of the encapsulant layer is in the range of about 0.5 mils (0.012 mm) to about 2 mils (0.05 mm). Suitable polymeric materials include thermoplastic or thermosetting homopolymers and thermoplastic or thermosetting copolymers. Examples of polymeric materials that can be used include polyurethanes, polyolefins, polyacrylates, polyesters, polyamides, epoxies, or combinations thereof. In some embodiments, the encapsulant polymeric material is an adhesive such as a hot melt adhesive or a pressure sensitive adhesive. The adhesive can be tacky or non-tacky at room temperature. The acidity of the polymeric material is preferably sufficiently low to avoid corrosion of the electrodes. The encapsulant material can include a desiccant such as, for example, CaO, BaO, SrO, and MgO. The encapsulant material can be applied as a pre-formed layer or as a solution or dispersion using printing or patterning methods. A suitable hot melt adhesive containing a desiccant is DesiMax™ from Multisorb Technologies Inc. (Buffalo, N.Y.). A suitable encapsulant includes ethylene vinyl acetate or modified polyolefin thermoplastics such as 3M™ Thermo-bond (available from 3M of St. Paul, Minn.). The segments may also be encapsulated in glass sheets as described in U.S. Pat. No. 6,355,125, incorporated herein by reference.

Figure 4:
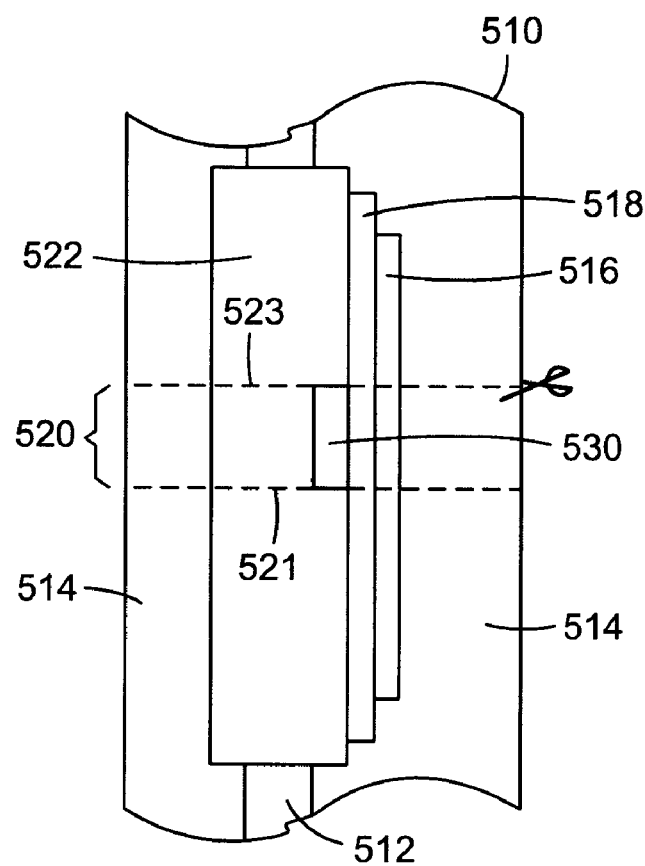
FIG. 4 depicts a plan view of an exemplary method of preparing organic light-emitting segments for use in the invention.

With reference to FIG. 4, the segments of the OLED device of the invention are preferably manufactured in a continuous roll-to-roll process wherein substrate 512 is a flexible transparent or semi-transparent plastic material provided in a roll or formed on a liner 510 by for example coating a polymerizable material and curing the material in-line. The anode 514 (e.g. ITO) is typically pattern coated onto the substrate 512. The hole transport layer 516 is pattern coated in a same fashion as the anode. The light-emitting (e.g. LEP) layer 518 may be coated continuously or in a pattern followed by pattern coating of the cathode. The patterning is done primarily to provide the anode 514 electrically isolated from the cathode 522. Upon completion a discrete OLED segment can be obtained by severing the web in cross-web direction such that the each segment comprises a single light-emitting area 530 or a plurality of light emitting segments wherein each of the areas of the segment emit light.

A preferred roll-to roll process employing an electrode (e.g. anode) that is continuous in the direction of the advancing web is described in concurrently filed Attorney Docket No. 59346US002, entitled "Method of Making an Organic Light Emitting Device"; incorporated herein by reference.

Both the anode and cathode electrical contact(s) of each segment are accessible along a peripheral edge of the segment. The electrodes may extend beyond the outer periphery of the light-emitting structure. In one embodiment, the anode is pattern coated such that the striation(s) range from being substantially parallel to substantially diagonal with the direction of the advancing web. Accordingly, the anode contact is accessible along the peripheral edge 521 or 523 upon severing the web in cross direction. In an alternative embodiment, the cathode is patterned such that the striation(s) range from being substantially parallel to substantially diagonal with the direction of the advancing web and the anode is disposed in a pattern perpendicular to the cathode. The cathode is generally applied in a manner such that the striations of the pattern are perpendicular to the anode pattern.

The organic electroluminescent devices described herein can be used, for example, as backlights such as single color (e.g. white) and multiple colored large area lamps (e.g. ceiling panel lighting fixture); fixed and variable message signage (e.g. traffic control) as well as low and high resolution displays such as for use in advertising, toys, personal protection apparel and the like. In the case of conspicuity uses, it is preferred to employ red, orange or yellow coloring optionally in combination with contrasting (e.g. black) indicia or symbols. The device is also suitable for various safety lighting applications (e.g. emergency lighting strips for steps).

Depending on the intended end use the OLED device of the invention may be employed in combination with other optional components. Optional components may include for example one or more polarizers, wave plates, touch panels, antireflective coatings, anti-smudge coatings, projection screens, brightness enhancement films, diffuser or other optical components, coatings, user interface devices, or the like.

Applications for low resolution displays include graphic indicator lamps (e.g., icons); segmented alphanumeric displays (e.g., appliance time indicators); small monochrome passive or active matrix displays; small monochrome passive or active matrix displays plus graphic indicator lamps as part of an integrated display (e.g., cell phone displays); large area pixel display tiles (e.g., a plurality of modules, or tiles, each having a relatively small number of pixels), such as may be suitable for outdoor display used; and security display applications.

Applications for high resolution displays include active or passive matrix multicolor or full color displays; active or passive matrix multicolor or full color displays having monochrome portions or graphic indicator lamps and security display applications.

EXAMPLE 1

A UV-curable polymer solution was made containing 80 grams of epoxy acrylate, commercially available from UCB Chemicals, Smyrna, Ga. under the trade designation "Ebecryl 629"; 20 grams of dipentaaerithritol penta acrylate, commercially available from Sartomer Company, Exton, Pa. under the trade designation "SR399"; and 2 grams of 1-hydroxy-cyclohexyl-phenyl ketone, commercially available from Ciba Specialty Chemicals, Tarrytown, N.Y. under the trade designation "Irgacure184" dissolved in 1000 grams of methyl ethyl ketone. The resulting solution was coated at a web speed of 20 ft/min on a 6.5 inch wide, 100 micron polyethylene terephthalate ("PET") liner commercially available from Teijin Corp., Japan under the trade designation "HSPE 100" using a microgravure coater commercially available from Yasui Seiki, Japan under the trade designation "Model CAG150" fitted with a 110R knurl. The coating was dried in-line at 70° C. and cured under a nitrogen atmosphere with UV lamp commercially available from Fusion UV systems, Gaithersburg, Md. under the trade designation "F-600 Fusion D UV lamp" operating at 100% power, resulting in a coating thickness of approximately 0.7 µm resulting in a transparent substrate web.

A die cut polymer web mask commercially available from 3M Company, under the trade designation "Scotchpak 1220" having the pattern shown in FIG. 7, was thermally laminated in a roll-to-roll laminator to the UV cured polymer web, and approximately 35 nm of ITO, 10 nm of Ag and 35 nm of ITO was sequentially deposited using a DC sputtering process in a custom-designed coater fitted with two ceramic ITO targets available from Arconium, R.I., each operating at a pressure of 1 mTorr and 1 kW power. The web speed during the ITO coating process was 1.6 fpm and Argon and Oxygen flow rates 150 sccm and 6 sccm, respectively. These coating conditions resulted in a sheet resistance of 10 ohms/square. The ITO coating served as the anode connection for the OLED devices formed using this substrate.

The polymer mask was then peeled off, resulting in the conductive pattern shown in FIG. 5. A 4 inch diameter circular piece of the patterned web was cut from the roll and cleaned in an ultrasonic cleaning system. The ITO/Ag/ITO surface was then plasma treated for 2 minutes at a pressure of 300 mTorr, oxygen flow rate of 500 sccm and Rf power of 400 watts, in a plasma treater commercially available from AST, Inc. Billerica, Mass. under the trade designation "Model PS 500".

A hole transport material, (poly(3,4-ethylenedioxythiophene)/poly(styrenesulfonate), commercially available from H. C. Starck, Leverkusen, Germany under the trade designation "PEDOT 8000" also known as PEDT/PSS, was diluted to a concentration of 1 wt % with IPA and spin coated onto the ITO surface at 3000 rpm for 30 seconds, resulting in a PEDOT thickness of about 90 nm. The PEDOT coated films were dried in a 65° C. nitrogen purged oven for 10 minutes, and transferred into a nitrogen atmosphere glove box and placed onto a 100° C. hot plate for 2 minutes for further PEDOT drying.

A poly-phenylene vinylene light-emitting polymer dispersion, commercially available from Covion Organic Semiconductors GmbH, Frankfurt, Germany (0.5 wt % in toluene) under the trade designation "Covion PDY 132 LEP" was spin coated onto the PEDOT surface at 2500 rpm for 30 seconds, resulting in a 75 nm film thickness.

The LEP and PEDOT coated samples were trimmed to 50 mm×50 mm square and both coated layers wiped off from the edge to enable electrical contact. A 400 Å thick layer of Calcium cathode followed by 4000 Å of Silver was then deposited via thermal evaporation onto the LEP surface through a mask to form approximately 5 mm×15 mm light-emitting regions. The coated side of the device was then encapsulated by thermally laminating a 35 mm×35 mm copper foil using a hot melt adhesive commercially available from 3M Company under the trade designation "Thermobond 845". Two sides of the 50 mm×50 mm square samples were trimmed to obtain approximately 30 mm×50 mm devices. Six such devices were made. Two 10 inch long, ⅛ inch wide electrically conducting pressure sensitive transfer tape commercially available form 3M Company under the trade designation "3M Thermobond 845" was laminated to a 0.002" thick copper foil. The copper foil was trimmed to match the width of the conductive adhesive tape. The liner from the adhesive was then removed to expose the adhesive. The six light-emitting devices were arranged edge-to-edge and the cathodes of these six devices were taped together such that they were joined in electrical communication. The anodes of the six devices were also connected together and the devices were energized with a DC power supply operating at 8V. Each of the segments were tested to make sure that they emitted light, prior to connecting together. The individual segments of the connected device could be bent over the surface of a 3 inch diameter cylinder, and still retain the ability to emit light. The effect of repeated bending of an individual segment was not evaluated.

The invention has been described with reference to several specific embodiments foreseen by the inventor for which enabling descriptions are available. Insubstantial modifications of the invention, including modifications not presently foreseen, may nonetheless constitute equivalents thereto. Thus, the scope of the present invention should not be limited by the details and structures described herein, but rather solely by the following claims, and equivalents thereto.

What is claimed is:

1. An electronic device comprising at least two segments, each segment comprising an organic electronic light-emitting device comprising a light-emitting layer containing a light-emitting polymer, a doped light-emitting polymer, or a blended light-emitting polymer; wherein each segment is defined by peripheral edges; wherein each segment comprises a first electrical contact disposed on a first peripheral edge and a second electrical contact disposed on a different peripheral edge than the first electrical contact and the electrical contacts of each segment are joined in electrical communication with a conductive material.

2. The electronic device of claim 1 wherein the second electrical contact is disposed on a peripheral edge substantially perpendicular to the first peripheral edge.

3. The electronic device of claim 1 wherein the second electrical contact is disposed on a peripheral edge substantially parallel to the first peripheral edge.

4. The electronic device of claim 1 wherein each segment comprises a continuous substrate layer and the substrate layer is discontinuous between segments.

5. The electronic device of claim 1 wherein each segment comprises a light-emitting layer disposed between two conductive layers wherein the conductive layers are electrically isolated.

6. The electronic device of claim 1 wherein the conductive material is flexible.

7. The electronic device of claim 6 wherein the conductive material is selected from a metal foil, a conductive adhesive, metallized polymeric film, and combinations thereof.

8. The electronic device of claim 7 wherein the metal foil comprises copper.

9. The electronic device of claim 6 wherein the conductive material comprises a metal foil adhered to the segments by means of a conductive adhesive.

10. The electronic device of claim 1 wherein the electrical contacts of the segments are joined in series.

11. The electronic device of claim 1 wherein the electrical contacts of the segments are joined in parallel.

12. The electronic device of claim 1 wherein the device comprises a plurality of segments.

13. The electronic device of claim 12 wherein the plurality of segments are joined in a row.

14. The electronic device of claim 1 wherein each segment has a width up to about two inches.

15. The electronic device of claim 14 wherein each segment has a width of at least about ⅛ inch.

16. The electronic device of claim 1 wherein each segment has a length up to about 10 inches.

17. The electronic device of claim 16 wherein each segment has a length of at least about 1 inch.

18. The electronic device of claim 13 wherein a plurality of rows are joined in columns.

19. The electronic device of claim 1 wherein each segment is encapsulated.

20. The electronic device of claim 1 wherein the joined segments are encapsulated.

21. The electronic device of claim 18 wherein the device is a pixilated display.

22. The electronic device of claim 1 wherein said device is a backlight for an article selected from a lamp, a display, a sign, a toy, and personal protection apparel.

23. The electronic device of claim 22 wherein the sign or display includes a fixed or variable message.

24. The electronic device of claim 1 wherein the device emits a single color or multiple colors.

25. The electronic device of claim 1 wherein segments emitting different color light are independently adjustable.

26. An electronic device comprising at least two segments, each segment comprising an organic electronic light-emitting device comprising a light-emitting layer consisting of an organic electroluminescent material containing a small molecule emitter or a light-emitting small molecule doped polymer; wherein each segment is defined by peripheral edges; wherein each segment comprises a first electrical contact disposed on a first peripheral edge and a second electrical contact disposed on a different peripheral edge than the first electrical contact and the electrical contacts of each segment are joined in electrical communication with a conductive material.

27. The electronic device of claim 26 wherein each segment has a first dimension ranging from about ⅛ inch to about 2 inches, a second dimension ranging from about 1 inch to about 10 inches and the electrical contacts of the segments are joined in electrical communication with a conductive material.

28. The electronic device of claim 26 wherein the device is a pixilated display.

29. The electronic device of claim 26 wherein said device is a backlight for an article selected from a lamp, a display, a sign, a toy, and personal protection apparel.

30. The electronic device of claim 26 wherein the sign or display includes a fixed or variable message.

31. The electronic device of claim 26 wherein the device emits a single color or multiple colors.

32. The electronic device of claim 31 wherein segments emitting different color light are independently adjustable.

* * * * *

UNITED STATES PATENT AND TRADEMARK OFFICE
CERTIFICATE OF CORRECTION

| | |
|---|---|
| PATENT NO. | : 7,271,534 B2 |
| APPLICATION NO. | : 10/701337 |
| DATED | : September 18, 2007 |
| INVENTOR(S) | : Raghunath Padiyath et al. |

It is certified that error appears in the above-identified patent and that said Letters Patent is hereby corrected as shown below:

Column 2
Line 17-22 approx., Delete "removing the.....non-emitting segment(s)." and insert the same on Line 15, after "segment," as a continuation of the same Paragraph.

Signed and Sealed this

Twenty-seventh Day of November, 2007

JON W. DUDAS
*Director of the United States Patent and Trademark Office*